(12) United States Patent
Ray et al.

(10) Patent No.: US 11,114,179 B1
(45) Date of Patent: Sep. 7, 2021

(54) SYSTEMS AND METHODS FOR DETECTING COUNTERFEIT MEMORY

(71) Applicants: Biswajit Ray, Huntsville, AL (US); M. Tauhidur Rahman, Huntsville, AL (US)

(72) Inventors: Biswajit Ray, Huntsville, AL (US); M. Tauhidur Rahman, Huntsville, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 16/219,586

(22) Filed: Dec. 13, 2018

Related U.S. Application Data

(60) Provisional application No. 62/598,243, filed on Dec. 13, 2017.

(51) Int. Cl.
*G11C 29/14* (2006.01)
*G11C 29/10* (2006.01)
*G06F 3/06* (2006.01)

(52) U.S. Cl.
CPC ............ *G11C 29/14* (2013.01); *G06F 3/0619* (2013.01); *G06F 3/0652* (2013.01); *G06F 3/0653* (2013.01); *G06F 3/0673* (2013.01); *G11C 29/10* (2013.01)

(58) Field of Classification Search
CPC ....... G11C 29/14; G11C 29/10; G06F 3/0619; G06F 3/0652; G06F 3/0653; G06F 3/0673

USPC .......... 714/718, 719, 720, 721, 723, 42, 54; 365/200, 201
See application file for complete search history.

(56) References Cited

U.S. PATENT DOCUMENTS

| | | | | |
|---|---|---|---|---|
| 5,321,241 A | * | 6/1994 | Graine | G06Q 20/342 463/25 |
| 5,652,803 A | * | 7/1997 | Tachikawa | G07D 7/00 382/135 |

(Continued)

OTHER PUBLICATIONS

Guin et al., Counterfeit Integrated Circuits: A Rising Threat in the Global Semiconductor Supply Chain, Aug. 2014, IEEE, vol. 102, No. 8, pp. 1207-1228. (Year: 2014).*

(Continued)

*Primary Examiner* — John J Tabone, Jr.
(74) *Attorney, Agent, or Firm* — Maynard Cooper & Gale, P. C.; Jon E. Holland

(57) ABSTRACT

A system for testing memory includes logic that is configured to perform various normal memory operations (e.g., erase, read and write operations) on a memory device and to determine operational parameters associated with the memory operations. As an example, the amount of time to perform one or more memory operations may be measured, or a number of errors resulting from the memory operations may be counted or otherwise determined. One or more of the operational parameters may then be analyzed to determine whether they are in a range expected for counterfeit memory. If so, the logic determines that the memory under test is counterfeit (e.g., is recycled or counterfeit) and provides a notification about the authenticity of the memory. The logic may also estimate the age of the memory based on the operational parameters.

18 Claims, 5 Drawing Sheets

(56) References Cited

U.S. PATENT DOCUMENTS

| | | | | |
|---|---|---|---|---|
| 6,442,644 | B1* | 8/2002 | Gustavson | G06F 13/4243 |
| | | | | 711/105 |
| 6,659,353 | B1* | 12/2003 | Okamoto | G06Q 20/042 |
| | | | | 235/492 |
| 7,415,732 | B2* | 8/2008 | Montecalvo | G06F 21/71 |
| | | | | 713/193 |
| 8,572,440 | B1* | 10/2013 | Nunally | G06F 21/10 |
| | | | | 714/42 |
| 9,575,125 | B1* | 2/2017 | Andre | G11C 29/42 |
| 10,204,008 | B2* | 2/2019 | Trezise | G11C 29/42 |
| 10,223,199 | B2* | 3/2019 | Hahn | G11C 16/26 |
| 2007/0043667 | A1* | 2/2007 | Qawami | G06F 21/10 |
| | | | | 705/50 |
| 2007/0079387 | A1* | 4/2007 | Montecalvo | G06F 21/57 |
| | | | | 726/34 |
| 2008/0082872 | A1* | 4/2008 | Nagasaka | G06F 11/1068 |
| | | | | 714/719 |
| 2010/0125765 | A1* | 5/2010 | Orbach | G11C 7/20 |
| | | | | 714/718 |
| 2011/0234241 | A1 | 9/2011 | Lewis et al. | |
| 2012/0166814 | A1* | 6/2012 | Hayashi | G06F 21/79 |
| | | | | 713/189 |
| 2013/0127442 | A1* | 5/2013 | Satoh | G06F 21/44 |
| | | | | 324/76.77 |
| 2014/0075051 | A1* | 3/2014 | Zadesky | G06F 13/385 |
| | | | | 710/3 |
| 2014/0101063 | A1 | 4/2014 | Paul et al. | |
| 2014/0143619 | A1* | 5/2014 | Gorman | G11B 20/182 |
| | | | | 714/719 |
| 2017/0126229 | A1 | 5/2017 | Tan et al. | |
| 2018/0158493 | A1* | 6/2018 | Ryu | G06F 11/1048 |
| 2020/0372967 | A1* | 11/2020 | Rahman | G11C 7/24 |

OTHER PUBLICATIONS

Guin et al., Counterfeit IC Detection and Challenges Ahead, Jan. 2013, ACM SIGDA Newsletter, pp. 1-6. (Year: 2013).*

Guo et al., FFD: A Framework for Fake Flash Detection, Jun. 2017, ACM, pp. 1-6. (Year: 2017).*

Wang et al., Flash Memory for Ubiquitous Hardware Security Functions: True Random Number Generation and Device Fingerprints , 2012, IEEE, 33-47. (Year: 2012).*

Kumari et al., Independent Detection of Recycled Flash Memory: Challenges and Solutions, 2018, IEEE, pp. 89-95. (Not Used as Prior Art—For the Record Only). (Year: 2018).*

Guin, et al., "Counterfeit Integrated Circuits: A Rising Threat in the Global Semiconductor Supply Chain," Proceedings of the IEEE, Aug. 2014, pp. 1207-1228, vol. 102, No. 8.

* cited by examiner

SYSTEMS AND METHODS FOR DETECTING COUNTERFEIT MEMORY

CROSS REFERENCE TO RELATED APPLICATION

This application claims priority to U.S. Provisional Patent Application No. 62/598,243, entitled "Independent Detection of Recycled Flash Memory: Challenges and Solutions" and filed on Dec. 13, 2017, which is incorporated herein by reference.

RELATED ART

When a consumer purchases a new electronics device, such as a smartphone, the consumer expects that the device, including all of its components, are authentic and adhere to the specifications of the device's manufacture. However, some vendors sell electronics devices having counterfeit components, such as recycled memory, without informing the consumer of the use of the counterfeit components. Counterfeit memory is often less reliable than new memory from the manufacturer or the manufacturer's authorized suppliers, and the use of counterfeit memory can degrade the performance or useful life of the electronics device. In addition, counterfeit memory can sometimes contain malicious code or other code not authorized by the manufacture, and this code can pose a security threat or further affect the reliability of the electronics device.

In an effort to ensure authenticity of memory for use within electronics devices, techniques have been developed to detect the presence of counterfeit memory. However, such techniques can be expensive, burdensome, and/or invasive. Improved techniques for detecting counterfeit memory are generally desired.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for detecting counterfeit memory. In some embodiments of the present disclosure, various normal memory operations (e.g., erase, read, and write operations) are performed on a memory device, and operational parameters associated with the memory operations are measured or otherwise determined. As an example, the amount of time to perform one or more memory operations may be measured, or a number of errors resulting from the memory operations may be counted or otherwise determined. In other embodiments, other operational parameters indicative of performance of the memory operations may be used. One or more of the operational parameters may be analyzed to determine whether they are in a range expected for counterfeit memory. If not, it is determined that the memory under test is authentic (i.e., not counterfeit) and a notification about the authenticity of the memory may be generated.

The techniques described herein for testing memory do not require specialized hardware. Thus, it is possible to download a software application into an electronics device and execute the application using the normal hardware resources of the electronics device in order to test the device's memory. Indeed, the memory in the electronics device can be tested without having to change the hardware resources of the device. In other embodiments, software or hardware for testing memory may reside within a testing unit that can be interfaced with memory devices for testing purposes. Thus, many memory devices can be tested over time with the same testing unit. In other embodiments, other configurations of a system for testing memory are possible.

Figure 1:
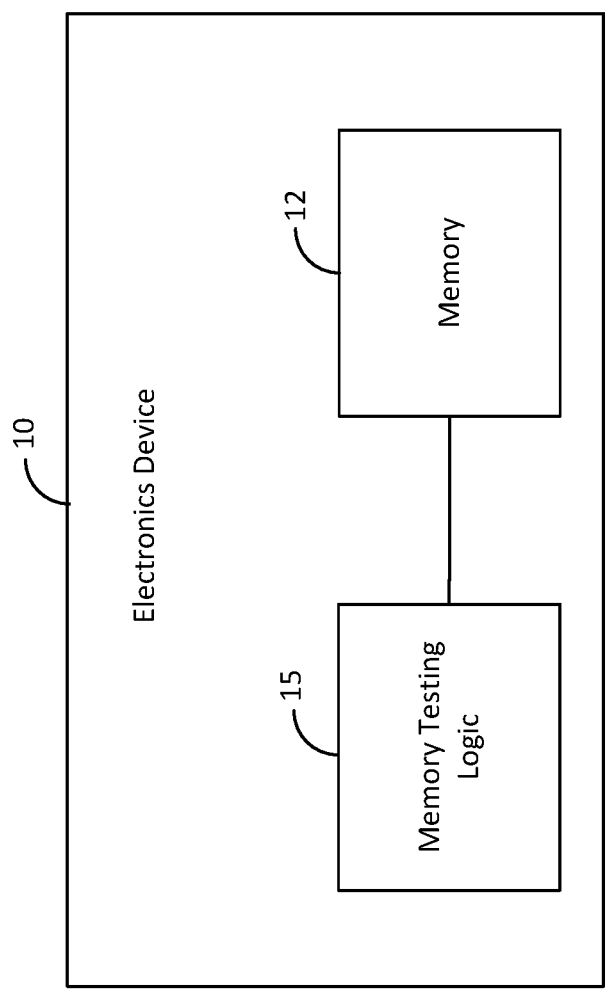
FIG. 1 is a block diagram illustrating an exemplary electronics device configured to detect counterfeit memory in accordance with some embodiments of the present disclosure.

FIG. 1 depicts a block diagram of an electronics device 10 configured to test memory for authenticity in accordance with some embodiments of the present disclosure. In this regard, "authenticity" generally refers to whether memory is counterfeit (e.g., is recycled or from an unauthorized source). That is, memory is not authentic or, in other words, is counterfeit if it has been recycled (previously used by another user) or is from an unauthorized source.

As shown by FIG. 1, the electronics device 10 comprises memory 12 and memory testing logic 15 that is configured to test the memory 12 to determine whether it is counterfeit. In some embodiments, the electronics device 10 may be a smartphone or other mobile device, but in other embodiments, the electronics device 10 may be any device that has or uses memory. As an example, the electronics device 10 may be a desktop or laptop computer or other type of computing device known in the art. In some embodiments, as will be described in more detail below, the electronics device 10 may be a testing unit adapted to receive one or more removable memory units for testing. Yet other types of electronics devices 10 are possible in other embodiments.

Figure 2:
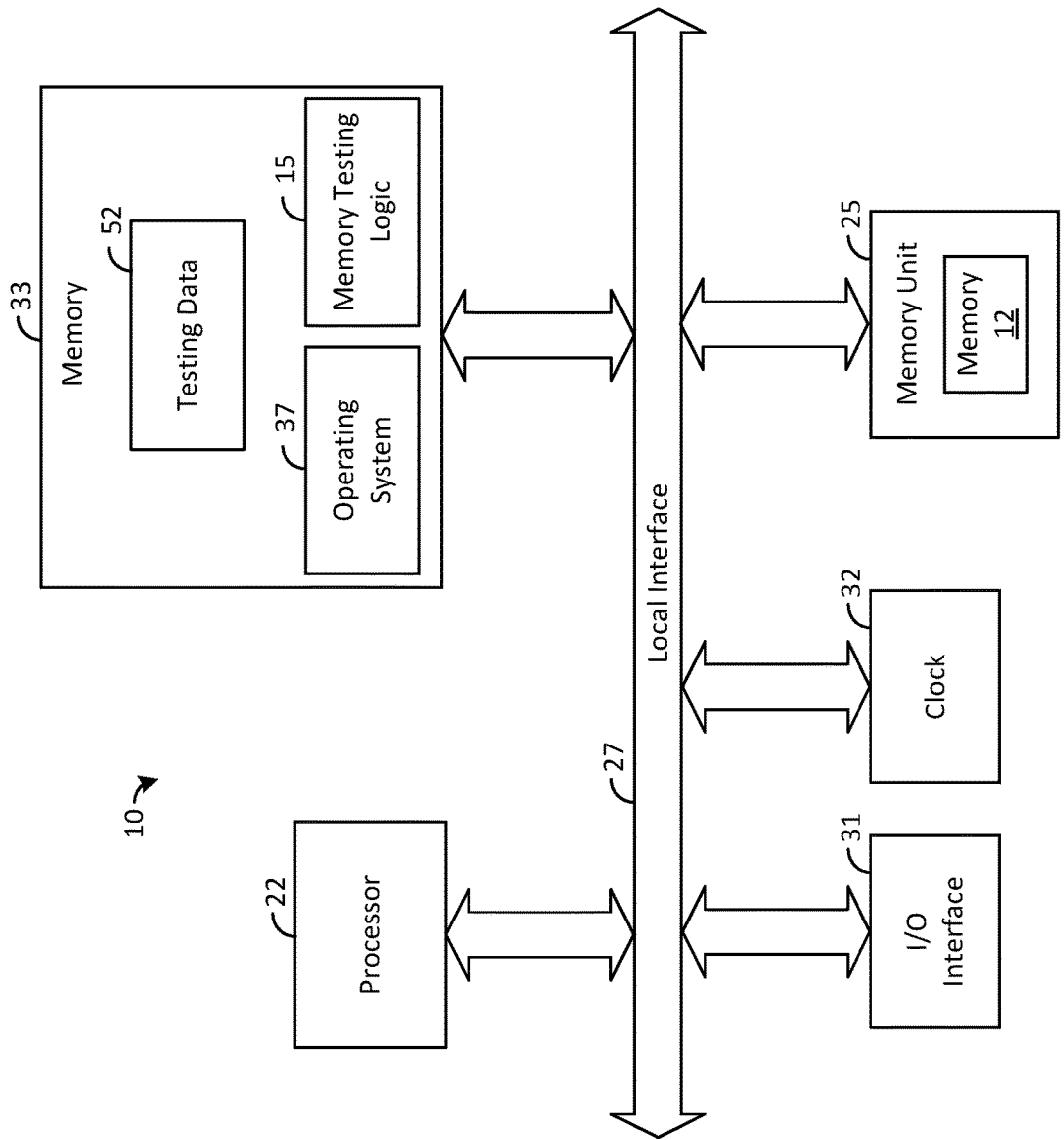
FIG. 2 is a block diagram illustrating an exemplary electronics device, such as is depicted by FIG. 1.

As shown by FIG. 2, the electronics device 10 may include at least one processor 22, a memory unit 25 (e.g., memory chip, disc, or card) having memory 12, a local interface 27, an input/output (I/O) interface 31, and a clock 32. In some embodiments, memory testing logic 15 is implemented in software and stored in memory 33 of the electronics device 10, which may include processing hardware for executing instructions stored in memory 33, such as processor 22. As an example, the processor 22 may comprise a central processor (CPU) or a digital signal processor (DSP) for executing instructions. The processor 22 communicates to and drives the other elements within the electronics device 10 via a local interface 27, which can include at least one bus. In other embodiments, the memory testing logic 15 may be implemented in hardware, such as a field programmable gate array (FPGA), or a combination of hardware and software.

Memory 33 may be a tangible storage medium. Examples of tangible (or non-transitory) storage medium include disks, thumb drives, hard drives, and other forms of memory. Tangible computer readable storage medium include volatile and non-volatile, removable and non-removable media, such as computer readable instructions, data structures, program modules or other data. Examples of such media include RAM, ROM, EPROM, EEPROM, flash memory, disks or optical storage, magnetic storage, or any other non-transitory medium that stores information.

In some embodiments, input/output interface 31 may comprise various hardware or any combination of hardware and software for receiving inputs from and providing outputs to one or more sources. In some embodiments, input/output interface 31 may comprise a display device for displaying content to a user and an input device for receiving inputs from the user. For example, input/output interface 31 may comprise a touchscreen for displaying a GUI and facilitating communication with a user, such as via capacitive sensing or otherwise. In some embodiments, the input/output interface 31 may be configured for communicating information to a user of the electronics device 10 indicative of testing by the memory testing logic 15, such as an alert or report. In addition, input/output interface 31 may include components (e.g., a cellular or RF radio) to enable the electronics device 10 to communicate with other data sources, such as other electronics devices 10, and may include various components (e.g., hardware) for communication using various protocols and techniques (e.g., Bluetooth, NFC, etc.). Input/output interface 31 may comprise other components in other embodiments.

The memory unit 25 may be a removable unit that is capable of being coupled to and removed from the electronics device 10. The memory 12 within the memory unit 25 may be flash memory, but other types of memory are possible in other embodiments. The memory unit 25 also may include circuitry for performing various functions, such as reading from and writing to the memory 12. In some cases, such circuitry may perform error correction, as will be described in more detail below, in order to correct for errors that occur in the memory 12. Commonly-assigned U.S. patent application Ser. No. 15/717,598, entitled "Flash Memory-Based Radiation Sensing" and filed on Sep. 27, 2017, which is incorporated herein by reference, describes exemplary flash memory cells and techniques for writing to, reading from, and erasing such memory cells.

As shown by FIG. 2, the electronics device 10 may include an operating system 37 that may be implemented in software and may include instructions that, when executed by the processor 22, control execution or operation of various resources of the electronics device 10. The processor 22 may execute operating system 37 to control memory unit 25 and execute instructions of the memory testing logic 15, receive inputs and provide outputs, such as a GUI or other content to a user via input/output interface 31. Operating system 37 may include other functionality ascribed to software operating systems as may be generally known in the art.

Also, stored in the memory 33 is testing data 52 that may be used by the memory testing logic 15 to test the memory 12. As an example, the memory testing logic 15 may determine various parameters associated with the memory 12, and the testing data 52 may indicate expected ranges for such parameters. As an example, the testing data 52 may include predefined thresholds that the logic 15 may compare to the parameters in order to determine whether the parameters indicate that the memory 12 is counterfeit, as will be described in more detail below.

In some embodiments, the testing logic 15 is configured to initiate various normal memory operations that are performed by the memory unit 25 and to then determine operational parameters indicative of the performance of the memory unit 25 in executing the operations. As an example, the operations may include read, write, and erase operations.

In this regard, for a read operation, the memory testing logic 15 may generate a read request that is communicated by the operating system 37 to the memory unit 25. In response to the read request, the memory unit 25 may be configured to read data at a memory address specified by the read request and return the read data to the memory testing logic 15.

For a write operation, the memory testing logic 15 may generate a write request that is communicated by the operating system 37 to the memory unit 25. In response to the write request, the memory unit 25 may be configured to write data from the write request to a memory address specified by the write request. Once the write request is completed, the memory unit 25 returns a notification that is communicated to the memory testing logic 15.

For an erase operation, the memory testing logic 15 may generate an erase request that is communicated by the operating system 37 to the memory unit 25. In response to the erase request, the memory unit 25 may be configured to erase the memory cells at a memory address specified by the erase request. Once the erase request is completed, the memory unit 25 returns a notification that is communicated to the memory testing logic 15.

For a given operation, the memory testing logic 15 is configured to determine one or more operational parameters indicative of the performance of the memory unit 25 in performing the operation. As an example, as will be described in more detail below, the memory testing logic 15 may be configured to determine a duration of the operation or a number of errors generated by the memory unit 25, although other types of operational parameters may be determined in other embodiments. The memory testing logic 15 is configured to compare the one or more operational parameters to the testing data 52 to determine whether the memory 12 is counterfeit. In some cases, the memory testing logic 15 may estimate the age of the memory 12 based on comparisons of the one or more operational parameters to the testing data 52. If desired, a given operational parameter may be averaged over time or otherwise combined with other operational parameters for comparison to the testing data 52. As an example, the durations of a plurality of memory operations of the same type (e.g., write operations) may be averaged or otherwise combined mathematically.

Note that there are various techniques that may be used to determine whether the memory 12 is counterfeit and/or to estimate the age of the memory 12. As an example, the duration of an operation performed by the memory 12 may be used to determine whether the memory 12 is counterfeit. In this regard, a manufacturer of the device 10 or memory 12 may publish an amount of time expected for each operation (e.g., an average amount of time or range required to perform the operation). If the measured duration differs by the expected range by at least a threshold amount, then a determination may be made that the memory 12 is counterfeit (e.g., is recycled or from an unauthorized source).

In this regard, as the memory 12 is used and ages, it may take longer for operations (e.g., read, write, or erase operations) to complete. Also, if the memory 12 is provided from an unauthorized source, then the memory 12 may have different operational characteristics, such as durations of read, write, or erase operations, relative to memory from an authorized source. Thus, if the measured amount of time required to perform an operation exceeds the expected amount of time by at least a threshold amount, then a determination may be made that the memory 12 is counterfeit. In some embodiments, the memory testing logic 15 is configured to determine a difference in the amount of time required to perform an operation and the amount of time expected to perform the operation, as indicated by the testing data 52, and to then compare the difference to a predefined threshold indicated by the testing data 52. If the threshold is exceeded, then the memory testing logic 15 determines that the memory 12 is counterfeit. If desired, the memory testing logic 15 may compare the average amount of time required to perform the operation over time and compare the average time to the testing data 52 in a similar manner. In other embodiments, other techniques for comparing the operational parameters to the testing data 52 are possible.

Note that there are various techniques that may be used to determine the duration of an operation. In some embodiments, the memory testing logic 15 uses the clock 32 (FIG. 2) to determine the time from submission of a request for the operation to the time that the memory testing logic 15 receives notification that the operation is complete. For example, when the memory testing logic 15 submits a read request to the operating system 37, the memory testing logic 12 may receive a timestamp from the clock 32 indicative of the approximate time that the read request is submitted to the operating system 37. Upon receiving the data returned from the memory unit 25 for the read request, the memory testing logic 12 may receive a timestamp from the clock 32 indicated of the approximate time that the data is received. Note that the returned data may server as notice that the read operation is complete. The difference in the foregoing two timestamps may be calculated to determine the amount of time required to perform the read operation.

The durations of the write and erase operations may be similarly determined. For example, for a write operation, the memory testing logic 15 may use similar techniques to measure or otherwise determine the amount of time between submission of a write request to the operating system 37 and reception by the logic 15 of the notification that the write operation is complete. For an erase operation, the memory testing logic 15 may use similar techniques to measure or otherwise determine the amount of time between submission of an erase request to the operating system 37 and reception by the logic 15 of the notification that the erase operation is complete.

Note that other techniques may be used to determine whether the memory 12 is counterfeit. For example, data errors in the memory 12 may be detected and used to determine whether the memory 12 is counterfeit and/or to estimate the age of the memory 12. In this regard, as memory 12 is used or ages, portions of the individual memory cells, such as oxide layers, may become damaged or worn affecting the memory cell's ability to hold charge. This damage to the memory cell, depending on the extent of such damage, may cause the memory cell to store an incorrect bit value. Generally, a higher number of errors indicates that the memory 12 is older and has been used more.

As indicated above, the memory unit 25 may be configured to perform error correction (e.g., cyclic-redundancy-check (CRC) error correction) in order to correct errors in the data retrieved from memory 12. As known in the art, CRC error correction generally involves appending redundant information to a data value and comparing the data value to the redundant information in order to detect and correct errors in the data value. Thus, by using error correction, the data values returned by the memory unit 25 in response to read requests should have less data errors than the data values actually stored in memory 12.

There are various techniques that may be used by the memory testing logic 15 to detect errors in the memory 12. In one exemplary embodiment, the memory testing logic 15 provides one or more write requests for writing at least one block of data into memory 12. The memory testing logic 15 then submits one or more read requests for reading the block of data from the memory 12. The memory testing logic 15 then compares the block of data written to memory 12 to the same block of data received from the memory 12 in order to determine a number of errors in the returned data. The memory testing logic 15 also compares the number of errors to one or more predefined thresholds. If the number of errors is greater than a certain threshold indicated by the testing data 52 or otherwise, the memory testing logic 15 determines that the memory 12 is counterfeit (e.g., recycled). In such case, the memory testing logic 15 may display via the I/O interface 31 or otherwise a message indicating that the memory 12 is determined to be counterfeit (e.g., recycled).

The memory testing logic 15 may also be configured to estimate an age of the memory 12 based on the number of errors detected or other operational parameters, such as the duration required to perform one or more memory operations. In this regard, a higher number of errors generally indicates greater age. The testing data 52 may define various ages or age ranges and correlate with each age or age range a range of errors expected for memories within the correlated age or age range. In such embodiment, the memory testing logic 15 may consult the testing data 52 to determine one or more values indicative of the memory's estimated age or age range correlated with the number of errors detected from the memory 12, and the memory testing logic 15 may display via the I/O interface 31 or otherwise a message including such value or values to indicate the memory's estimated age. In other embodiments, messages indicating whether the memory is counterfeit and/or the memory's estimated age may be transmitted to another device (e.g., a remote server) for display.

In another embodiment, the age estimate may be based on the duration required to complete one or more memory operations. As an example, the durations required to perform memory operations may be determined according to the techniques described above. If desired, the average duration of a particular type or types of memory operations may be determined, as described above for determining authenticity. A longer duration may generally indicate that the memory 12 is older, and the memory testing logic 15 may be configured to estimate age, wherein a longer duration corresponds to a greater age estimate. Other techniques for estimating age are possible in other embodiments.

Note that if the memory unit 25 uses error correction, the memory testing logic 15 may be configured to disable such error correction before writing and reading data for testing the memory 12. In this regard, the protocol used by the operating system 37 may define a function call for disabling error correction in the memory unit 25. In such embodiment, the memory testing logic 15, before initiating a test of the memory 12, may submit such function call to the operating system 37, which then instructs the memory unit 25 to disable error correction. Thus, during the testing, the data values returned to the memory testing logic 15 are not corrected for errors by the memory unit 25 allowing the memory testing logic 15 to determine the total number of errors in memory 12 for the data written to and read from memory 12.

In addition, it has been observed that a more accurate determination about the state of the memory 12 can be made, using the error detection techniques described above, if an operation, referred to herein as "stressing," is performed on the memory 12 prior to testing. Stressing the memory 12 involves repetitively performing one or more memory operations, such as writing, reading, and erasing, on cells of the memory 12 to be tested. Repetitively changing the values in the memory cells causes the charge levels in the memory cells to fluctuate so that, if a memory cell is damaged, it is more likely that a data error will be exhibited by the cell during testing. Thus, by stressing the memory 12 just prior to testing, the error count determined in testing is more likely to better reflect the actual number of memory cells that are damaged. That is, the number of bit errors determined in testing is likely closer to the actual number of memory cells that are damaged.

Erase and read operations generally wear on the memory cells more than writing operations. That is, erase and read operations have a greater effect on memory degradation relative to writing operations. Thus, in an effort to reduce memory degradation resulting from the testing, the stressing initiated by the memory testing logic 15 only includes writing of data values to memory 12 in a preferred embodiment and, in particular, does not include erase or read operations. As an example, prior to testing, the memory testing logic 15 may write random or predefined values to all of the memory cells to be tested a certain number of times (e.g., about ten or more) so that damaged memory cells are more likely to exhibit bit errors during testing. However, in other embodiments, the stressing may involve other types of memory operations.

Operations that can be performed without causing damage to the memory cells of the memory 12 under test can be referred to as "non-invasive." The stressing described above with the use of write operations is generally non-invasive since write operations do not significantly degrade memory. Further, measuring durations of memory operations in non-invasive and counting errors in values returned from memory are both non-invasive. Indeed, it is possible for durations or errors associated with memory operations performed in normal operation of the electronics device 10 to be used for determining authenticity or estimating age. That is, the memory operations do not have to be specifically performed for testing purposes, but rather operational parameters associated with memory operations performed as part of the normal operation of the electronics device 12 may be used for testing. Moreover, the techniques described herein may be non-invasive to the memory 12 being tested.

Figure 3:
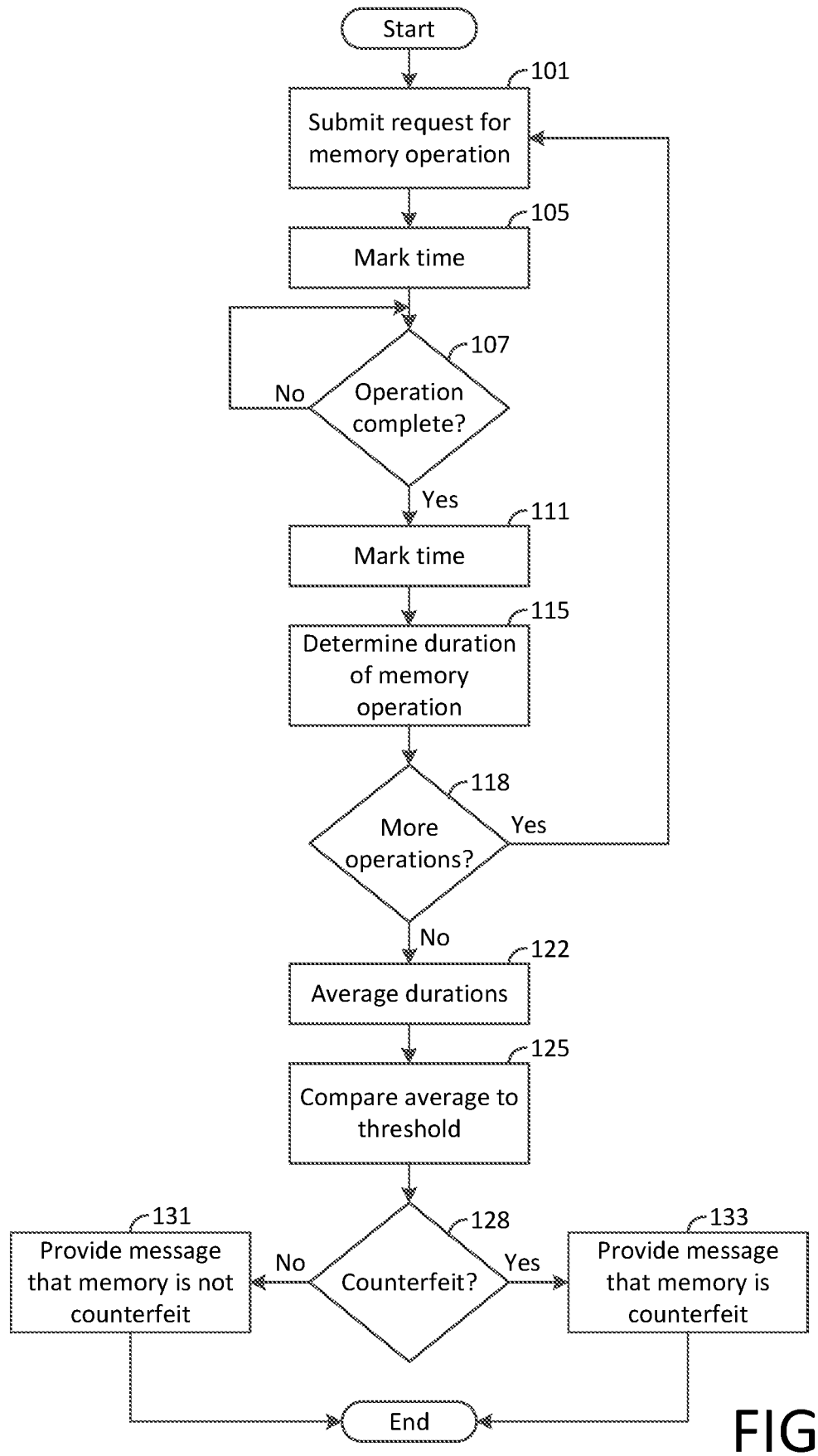
FIG. 3 is a flow chart illustrating an exemplary method for testing an electronics device, such as is depicted by FIG. 2.

An exemplary testing operation will now be described in more detail below with reference to FIG. 3.

In this regard, for illustrative purposes, assume that the memory testing logic 15 is configured to perform testing based on the durations of write operations, though it is possible for other memory operations and testing techniques to be used, as described above. As shown by blocks 101 and 105 of FIG. 3, the memory testing logic 15 submits to the operating system 37 a write request for writing to the memory 12, and the logic 15 also marks the time that the write request is submitted to the operating system 37. In response, the operating system 37 causes the memory unit 25 to perform the requested write operation. Once the write operation is completed, the operating system 37 is notified by the memory unit 25 and provides a notification of the completed write operation to the memory testing logic 15.

As shown by blocks 107 and 111, the memory testing logic 15 may wait on the notification and mark the time that the logic 15 receives the notification from the operating system 37. Based on the times marked in blocks 105 and 111, the memory testing logic 15 determines the duration of the write operation, as shown by block 115. The memory testing logic 15 then determines if more write operations are to be performed for the testing, as shown by block 118. If so, the memory testing logic 15 repeats the steps described above.

Once all of the write operations for the test have been performed, the memory testing logic 15 averages the durations determined in block 115 for all of such write operations to provide a value indicative of the average time required for the write operations to be completed, as shown by block 122. As shown by block 125, the memory testing logic 15 compares the averaged value to a predefined threshold. If the threshold is exceeded, the memory testing logic 15 determines that memory 12 is counterfeit in block 128 and provides a message indicating such determination, as shown by block 133. Otherwise, the memory testing logic 15 determines that memory 12 is not counterfeit in block 128 and provides a message indicating such determination, as shown by block 131.

Figure 4:
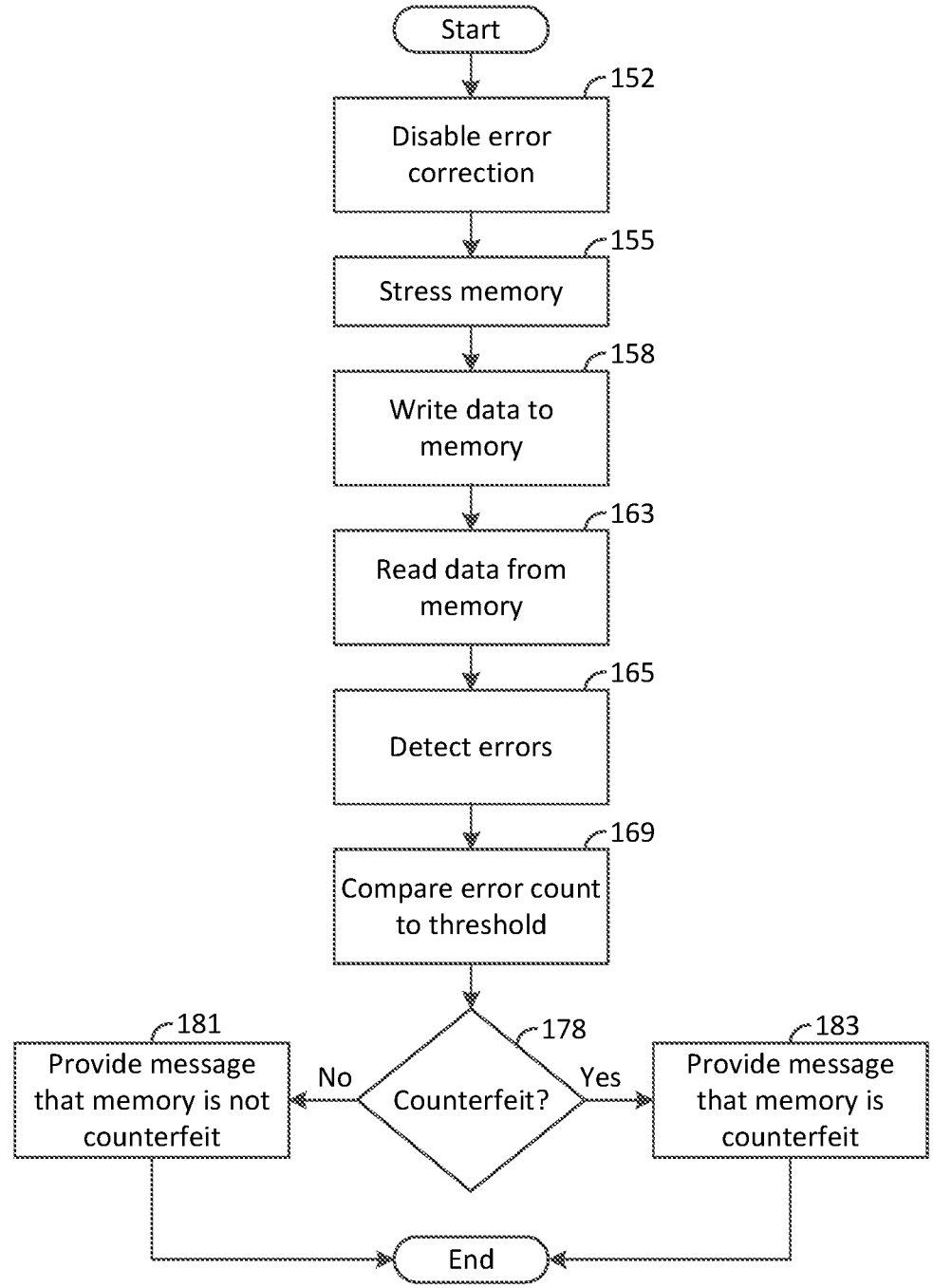
FIG. 4 is a flow chart illustrating an exemplary method for testing an electronics device, such as is depicted by FIG. 2.

An exemplary testing operation will now be described in more detail below with reference to FIG. 4.

In this regard, for illustrative purposes, assume that the memory testing logic 15 is configured to perform testing based on data errors detected in the memory 12, though it is possible for other memory operations and testing techniques to be used, as described above. As shown by block 152 of FIG. 4, the memory testing logic 15 disables error correction in the memory unit 25, assuming that error correction is in fact used by the memory unit 25. As shown by block 155, the memory testing logic 15 then stresses the memory 12 by performing a plurality of data writes to the memory 12. In this regard, the memory testing logic 15 may submit write requests to the operating system 37, which controls the memory unit 25 to perform the requested write operations, as described above.

As shown by blocks 158 and 163, the memory testing logic 15 writes a block of data to the memory 12 and then reads this block of data from the memory 12. In this regard, the memory testing logic 15 may submit one or more write requests and read requests to the operating system 37, which then controls the memory unit 25 to perform the requested write operations and read operations, as described above. The memory testing logic 15 compares the data block written to the memory 12 in block 158 and the data block read from the memory 12 in block 163 in order to determine a number of data errors in the returned data block, as shown by block 165. The memory testing logic 15 also compares the number of errors to a predefined threshold, as shown by block 169. If the threshold is exceeded, the memory testing logic 15 determines that memory 12 is counterfeit in block 178 and provides a message indicating such determination, as shown by block 183. Otherwise, the memory testing logic 15 determines that memory 12 is not counterfeit in block 178 and provides a message indicating such determination, as shown by block 181. Note that the number of data errors may also be used to estimate the age of the memory 12, as described above, and the estimated age of the memory 12 may be included in the message provided by the memory testing logic 15.

In various embodiments described above, it is possible for instructions of the memory testing logic 15 to be downloaded into conventional electronics devices 10, such as smartphones, and executed to perform the testing operations described above without requiring specialized hardware to be added to the conventional electronics devices 10. That is, conventional electronics devices can be retrofitted to perform the memory testing described herein by simply downloading instructions of the memory testing logic 15 into the electronics device 10 or otherwise providing the electronics device 10 with access to the memory testing logic 15. However, it is also possible to design new electronics devices 10 or redesign the hardware of existing electronics devices 10 to implement the memory testing techniques described herein.

Figure 5:
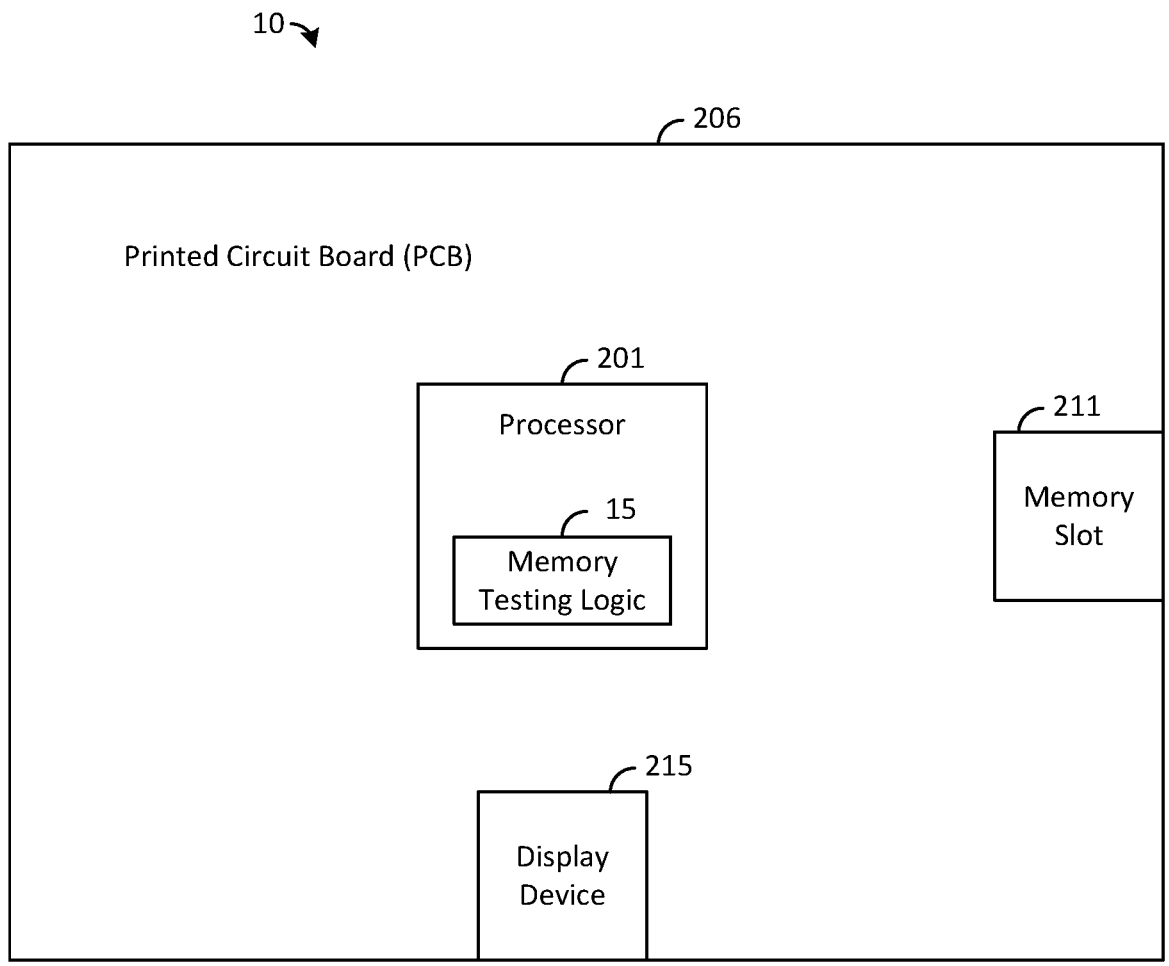
FIG. 5 is a block diagram illustrating an exemplary testing unit in accordance with some embodiments of the present disclosure.

FIG. 5 depicts an exemplary embodiment of an electronics device 10 that may be used to test the memory 12 of a large number of memory units 25. Specifically, the electronics device 10 defines a testing unit that may be used to test memory 12 to be inserted into and used by other electronics devices. In this regard, the memory testing logic 15 is implemented in software in the embodiment depicted by FIG. 5, though it is possible for the memory testing logic 15 to be implemented in hardware or a combination of hardware and software. In the embodiment shown by FIG. 5, the memory testing logic 15 is stored in and executed by at least one processor 201. As shown by FIG. 5, the processor 201 and other components of the electronics device 10 reside on a printed circuit board (PCB) 206, though other configurations of the electronics device 10 are possible in other embodiments.

The electronics device 10 of FIG. 5 includes a memory slot 211 into which a memory unit 25, such as a memory chip, disc, or card, may be inserted and removed. When a memory unit 25 is inserted into the slot 211, the memory testing logic 15 may perform a test on the memory 12 of the memory unit 25 using techniques similar to those described above in order to determine whether the memory 12 is counterfeit and/or to estimate the age of the memory 12. The result of the test may be displayed by a display device 215, such as a liquid crystal display (LCD) or other type of display device. Yet other configurations of an electronics device 10 for testing the authenticity of memory are possible in other embodiments.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. An electronics device, comprising:
   a memory unit having memory; and
   at least one processor configured to initiate at least one memory operation for accessing the memory, the at least one processor configured to measure an amount of time for performance of the at least one memory operation and to determine whether the memory is counterfeit based on the measured amount of time, the at least one processor further configured to provide an output indicating whether the memory is determined to be counterfeit, wherein the at least one memory operation includes at least one of the group including: a write operation, a read operation, and an erase operation.

2. The electronics device of claim 1, wherein the at least one memory operation includes the write operation.

3. The electronics device of claim 1, wherein the at least one memory operation includes the read operation.

4. The electronics device of claim 1, wherein the at least one memory operation includes the erase operation.

5. The electronics device of claim 1, wherein the at least one processor is programmed with logic that is configured to generate a request for performing the at least one memory operation, wherein the logic is configured to determine a first time value for the request and a second time value for a notification from the memory unit that the at least one memory operation is complete, and wherein the logic is configured to measure the amount of time based on the first time value and the second time value.

6. The electronics device of claim 5, wherein the electronics device is a smartphone.

7. The electronics device of claim 1, wherein the at least one processor is configured to compare a value indicative of the measured amount of time to a threshold and to determine whether the memory is counterfeit based on comparison of the value to the threshold.

8. The electronics device of claim 1, wherein the at least one processor is configured to estimate an age of the memory based on the value.

9. An electronics device, comprising:
   a memory unit having memory; and
   at least one processor configured to perform a test for determining whether the memory is counterfeit, wherein the at least one processor in performing the test is configured to stress the memory by repetitively performing a plurality of memory operations on the memory and to initiate at least one read operation for reading the memory after sufficiently stressing the memory with the plurality of memory operations for damaging cells of the memory to cause errors in the at least one read operation, the at least one processor configured to determine an operational parameter indicative of a number of errors associated with the at least one read operation and to determine whether the memory is counterfeit based on the operational parameter, the at least one processor further configured to provide an output indicating whether the memory is determined to be counterfeit.

10. The electronics device of claim 9, wherein the plurality of memory operations includes write operations.

11. An electronics device, comprising:
    a memory unit having memory, the memory unit configured to perform error correction to correct errors in data read from the memory; and
    at least one processor configured to perform a test for determining whether the memory is counterfeit, wherein the at least one processor in performing the test is configured to:
        initiate at least one read operation for reading the memory;
        disable the error correction in the memory unit for the at least one read operation;
        determine an operational parameter indicative of a number of errors associated with the at least one read operation;
        determine whether the memory is counterfeit based on the operational parameter; and provide an output indicating whether the memory is determined to be counterfeit.

12. A method, comprising:
performing at least one memory operation for accessing memory, wherein the at least one memory operation includes at least one of the group including: a write operation, a read operation, and an erase operation;
measuring, with at least one processor, an amount of time for performance of the at least one memory operation;
determining, with the at least one processor, whether the memory is counterfeit based on the measured amount of time; and
providing an output indicating whether the memory is determined to be counterfeit.

13. The method of claim 12, wherein the measuring comprises:
providing a request for performing the at least one memory operation;
determining a first time value for the request;
receiving a notification that the at least one memory operation is complete; and
determining a second time value for the notification.

14. The method of claim 12, further comprising comparing a value indicative of the measured amount of time to a threshold, wherein the determining whether the memory is counterfeit is based on the comparing.

15. The method of claim 12, further comprising estimating, with the at least one processor an age for the memory.

16. The method of claim 12, wherein the electronics device is a smartphone.

17. A method for performing a test for determining whether memory is counterfeit, comprising:
stressing the memory by repetitively performing a plurality of memory operations on the memory;
performing at least one read operation for reading the memory after sufficiently stressing the memory with the plurality of memory operations for damaging cells of the memory to cause errors in the at least one read operation;
determining, with at least one processor, an operational parameter indicative of a number of errors associated with the at least one read operation;
determining, with the at least one processor, whether the memory is counterfeit based on the operational parameter; and
providing an output indicating whether the memory is determined to be counterfeit.

18. A method, comprising:
performing error correction in a memory unit of an electronics device to correct errors in data read from memory of the memory unit;
performing a test on the memory for determining whether the memory is counterfeit, wherein the performing the test comprises:
performing at least one read operation for reading the memory of the memory unit;
disabling the error correction for the at least one read operation;
determining, with at least one processor, an operational parameter indicative of a number of errors associated with the at least one read operation;
determining, with the at least one processor, whether the memory is counterfeit based on the operational parameter; and
providing an output indicating whether the memory is determined to be counterfeit.

* * * * *